(12) United States Patent
Morishima et al.

(10) Patent No.: US 10,601,000 B2
(45) Date of Patent: Mar. 24, 2020

(54) METHOD FOR PRODUCING ORGANIC DEVICE

(71) Applicant: SUMITOMO CHEMICAL COMPANY, LIMITED, Tokyo (JP)

(72) Inventors: Shinichi Morishima, Tsukuba (JP); Eiji Kishikawa, Osaka (JP); Masaya Shimogawara, Niihama (JP); Masato Shakutsui, Niihama (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 16/477,114

(22) PCT Filed: Dec. 1, 2017

(86) PCT No.: PCT/JP2017/043341
§ 371 (c)(1),
(2) Date: Jul. 10, 2019

(87) PCT Pub. No.: WO2018/131320
PCT Pub. Date: Jul. 19, 2018

(65) Prior Publication Data
US 2019/0363309 A1 Nov. 28, 2019

(30) Foreign Application Priority Data
Jan. 10, 2017 (JP) .................... 2017-001881

(51) Int. Cl.
*H01L 51/56* (2006.01)
*H01L 51/00* (2006.01)
(52) U.S. Cl.
CPC ............ *H01L 51/56* (2013.01); *H01L 51/003* (2013.01); *H01L 51/0021* (2013.01)

(58) Field of Classification Search
CPC .... H01L 51/56; H01L 51/0021; H01L 51/003
See application file for complete search history.

(56) References Cited

U.S. PATENT DOCUMENTS

2018/0175298 A1  6/2018  Sassa et al.

FOREIGN PATENT DOCUMENTS

| JP | 2006-294536 A | 10/2006 |
| JP | 2009-123532 A | 6/2009 |

(Continued)

OTHER PUBLICATIONS

International Preliminary Report on Patentability and Written Opinion of the International Searching Authority dated Jul. 25, 2019, for International Application No. PCT/JP2017/043341.

(Continued)

*Primary Examiner* — Matthew L Reames
(74) *Attorney, Agent, or Firm* — Birch, Stewart, Kolasch & Birch, LLP

(57) ABSTRACT

A method for producing an organic device 1, includes: first forming steps S02 and S03 of producing a support substrate 10 with an organic functional layer; a winding step S05 of winding the support substrate 10 with an organic functional layer and a protective film 13; a peeling step S06 of feeding out the protective film 13 and the support substrate 10 have been wound in, and peeling off the protective film 13; a heating step S07 of heating the support substrate 10 with an organic functional layer after the peeling step S06; and a second forming step S08 of forming at least one layer selected from the second electrode layer 9 and an organic functional layer 7 not formed in the first forming step S03 and being one of the organic functional layers comprising the multiple organic functional layers, after the heating step S07.

9 Claims, 7 Drawing Sheets

(56) References Cited

FOREIGN PATENT DOCUMENTS

| | | |
|---|---|---|
| JP | 2016-189355 A | 11/2016 |
| WO | WO 2012/172919 A1 | 12/2012 |
| WO | WO 2016/208597 A1 | 12/2016 |

OTHER PUBLICATIONS

International Search Report for International Application No. PCT/JP2017/043341, dated Jul. 19, 2018.

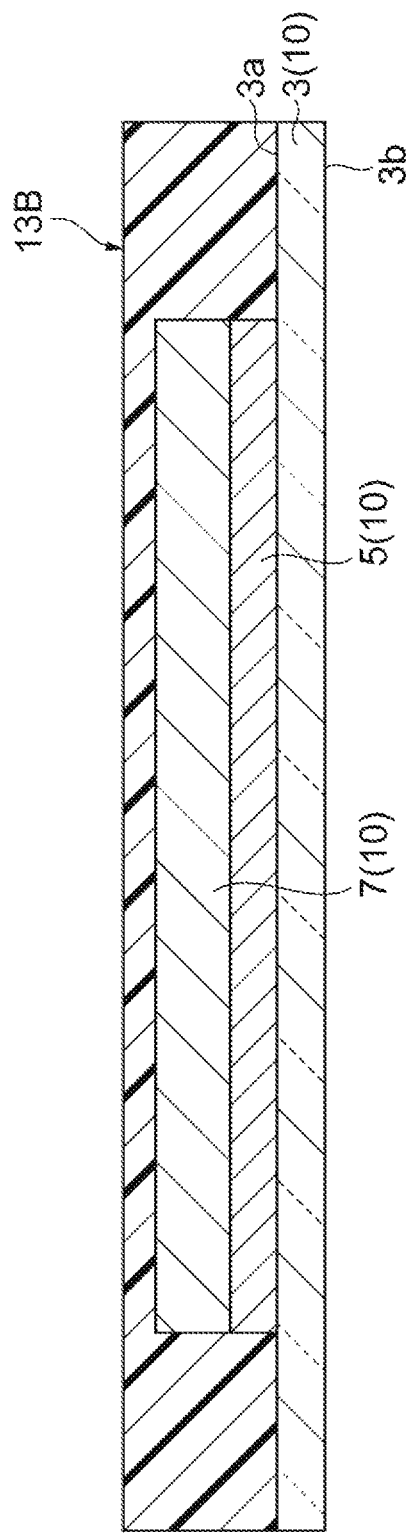

METHOD FOR PRODUCING ORGANIC DEVICE

TECHNICAL FIELD

The present invention relates to a method for producing an organic device.

BACKGROUND ART

For example, a method described in Patent Literature 1 is known as a method for producing an organic device of the related art. The method for producing the organic device described in Patent Literature 1 includes a step of forming a positive electrode layer on a support substrate having flexibility, a step of forming an organic functional layer on the positive electrode layer, and a step of forming a negative electrode layer on the organic functional layer. In the method for producing the organic device of Patent Literature 1, when the support substrate is wound after any one of various layers is formed, a protective film is arranged on the layer, and the support substrate and the protective film are wound together.

CITATION LIST

Patent Literature

Patent Literature 1: Japanese Unexamined Patent Application Publication No. 2006-294536

SUMMARY OF INVENTION

Technical Problem

As described above, in the method for producing the organic device, for example, the protective film is arranged on the organic functional layer, and thus, it is possible to prevent the organic functional layer from being in contact with the support substrate and from being damaged, or to prevent dirt, dust, and the like from being in contact with the organic functional layer. Here, in general, moisture or a component bleeding out from the protective film, such as a monomer, an oligomer, and an organic solvent (hereinafter, referred to as moisture and the like) is contained in the protective film. For this reason, in a case where the support substrate on which the protective film is arranged is stored by being wound, there is a case where the moisture and the like contained in the protective film are in contact with (permeate through) the organic functional layer. In a case where the moisture and the like are contained in the organic functional layer, for example, there is a case where a problem such as extension of a non-function exhibition region in a function exhibition region of the organic functional layer (in the case of an organic electroluminescence, a light emitting region) occurs. Accordingly, there is a concern that the properties of the organic device are degraded, and the reliability of the organic device decreases.

An object of one aspect of the present invention is to provide a method for producing an organic device in which reliability of an organic device can be improved.

Solution to Problem

A method for producing an organic device according to one aspect of the present invention, in which a first electrode layer, a single or multiple organic functional layers, and a second electrode layer are arranged on one main surface of a support substrate having flexibility in this order, includes: a first forming step of forming the first electrode layer and at least one layer of the organic functional layers on the support substrate to produce a support substrate with an organic functional layer; a winding step of winding the support substrate with an organic functional layer and a protective film by arranging the protective film on the organic functional layer after the first forming step; a peeling step of feeding out the protective film and the support substrate with the at least one layer of the organic functional layers that have been wound in, and peeling off the protective film before forming at least one layer selected from the second electrode layer and an organic functional layer not formed in the first forming step and being one of the organic functional layers comprising the multiple organic functional layers; a heating step of heating the support substrate with an organic functional layer before forming at least one layer selected from the second electrode layer and an organic functional layer not formed in the first forming step and being one of the organic functional layers comprising the multiple organic functional layers, after the peeling step; and a second forming step of forming at least one layer selected from the second electrode layer and an organic functional layer not formed in the first forming step and being one of the organic functional layers comprising the multiple organic functional layers, on the support substrate with an organic functional layer, after the heating step.

In the method for producing the organic device according to one aspect of the present invention, the protective film is peeled off, and then the support substrate is heated before forming at least one layer selected from the second electrode layer and an organic functional layer not formed in the first forming step and being one of the organic functional layers comprising the multiple organic functional layers. Accordingly, even in a case where moisture and the like are contained in the protective film that is wound along with the support substrate, and the moisture and the like are in contact with (permeate through) the organic functional layer, the moisture and the like of the organic functional layer are eliminated by the heating step. Therefore, in the method for producing the organic device, it is possible to suppress property degradation in an organic device due to the moisture and the like of the organic functional layer while protecting the organic functional layer with the protective film. As a result thereof, in the method for producing the organic device, it is possible to improve the reliability of the organic device.

In one embodiment, in the second forming step, the second electrode layer may be formed by a vacuum thermal evaporation method or a sputtering method. Accordingly, the second electrode layer is formed in a state of not being atmospherically exposed. Therefore, in the method for producing the organic device, it is possible to prevent the moisture and the like from being in contact with the organic functional layer and the second electrode layer, in the second forming step of forming the second electrode layer.

In one embodiment, in the heating step, the support substrate with an organic functional layer may be irradiated with an infrared ray. Accordingly, in the method for producing the organic device, it is possible to eliminate the moisture and the like of the organic functional layer.

In one embodiment, in the heating step, the only one main surface of the support substrate with an organic functional layer may be heated. As described above, in the method for producing the organic device, the one main surface of the support substrate with an organic functional layer on which the organic functional layer is formed is heated, and thus, it is possible to more effectively eliminate the moisture and the like of the organic functional layer.

In one embodiment, in the heating step, the support substrate with an organic functional layer may be heated under an atmosphere of inert gas, vacuum, or dry air. Accordingly, in the method for producing the organic device, it is possible to prevent the moisture and the like from being in contact with the organic functional layer, in the heating step.

In one embodiment, the protective film may include a base material, and an adhesive portion that is provided on the base material, and in the winding step, the protective film may be arranged on the organic functional layer such that the adhesive portion does not overlap with the organic functional layer. Accordingly, in the method for producing the organic device, when the support substrate with an organic functional layer and the protective film are wound together, it is possible to prevent the protective film from being shifted by the adhesive portion. In addition, in the method for producing the organic device, the adhesive portion is not arranged on the organic functional layer, and thus, when the protective film is peeled off, it is possible to prevent the organic functional layer from being broken by peeling off the surface of the organic functional layer, or the like.

In one embodiment, the protective film may include a base material, and an adhesive portion that is provided on the base material, and in the winding step, the protective film may be arranged on the organic functional layer such that the adhesive portion does not overlap with a function exhibition region of the organic functional layer. Accordingly, in the method for producing the organic device, when the support substrate with an organic functional layer and the protective film are wound together, it is possible to prevent the protective film from being shifted by the adhesive portion. In addition, in the method for producing the organic device, the adhesive portion is arranged not to overlap with the function exhibition region of the organic functional layer, and thus, the adhesive portion is arranged on a part of the organic functional layer, and even in a case where a part of the surface of the organic functional layer is peeled off when the protective film is peeled off, a function exhibition grade is not affected.

In one embodiment, in the first forming step, the organic functional layer may be formed by applying an organic material onto the first electrode layer and by drying the organic material. As described above, in a case where the organic functional layer is formed by a coating method, the organic functional layer is particularly easily affected by the moisture and the like. For this reason, the method for producing the organic device, in which the support substrate with an organic functional layer is heated before the remaining layer among the plurality of layers comprising the organic functional layers, or the second electrode layer is formed and after the protective film is peeled off, is particularly effective in a case where the organic functional layer is formed by the coating method.

In one embodiment, the support substrate with an organic functional layer may be conveyed under an atmosphere of vacuum, inert gas, or dry air, from the heating step to the second forming step. Accordingly, in the method for producing the organic device, the organic functional layer is not atmospherically exposed while the support substrate with an organic functional layer is conveyed to the second forming step from the heating step. For this reason, in the method for producing the organic device, it is possible to prevent the moisture and the like from being in contact with the organic functional layer.

Advantageous Effects of Invention

According to one aspect of the present invention, it is possible to improve the reliability of the organic device.

BRIEF DESCRIPTION OF DRAWINGS

FIG. 7 is a diagram illustrating a method for producing an organic EL element according to another embodiment.

DESCRIPTION OF EMBODIMENTS

Figure 1:
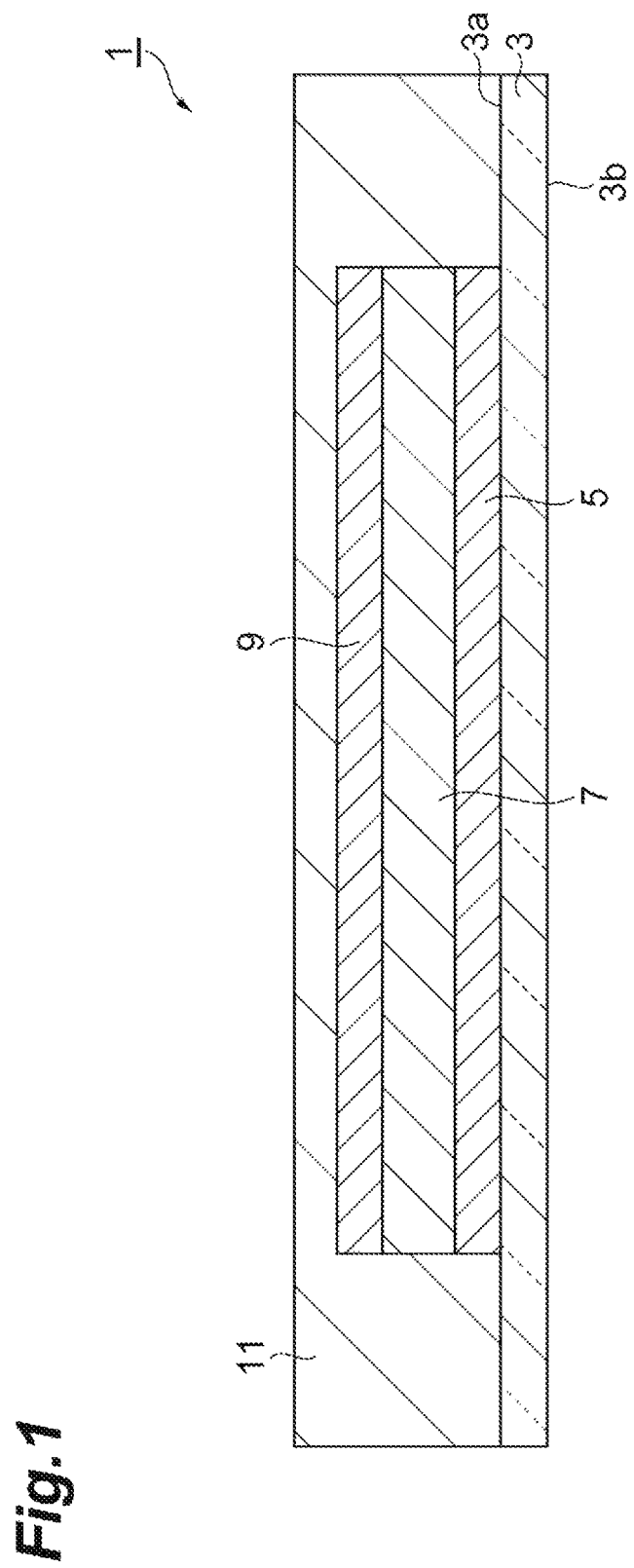
FIG. 1 is a sectional view of an organic EL element that is produced by a method for producing an organic device according to a first embodiment.

Hereinafter, preferred embodiments of the present invention will be described in detail, with reference to the attached drawings. Furthermore, in the description of the drawings, the same reference numerals will be applied to the same or the corresponding constituents, and the repeated description will be omitted.

(First Embodiment)

As illustrated in FIG. 1, an organic EL element (organic device) 1 that is produced by a method for producing an organic device of this embodiment includes a support substrate 3, a positive electrode layer (a first electrode layer) 5, an organic functional layer 7, a negative electrode layer (a second electrode layer) 9, and a sealing member 11.

[Support Substrate]

The support substrate 3 is configured of a resin having light transmittivity with respect to visible light (light having a wavelength of 400 nm to 800 nm). The support substrate 3 is a film-like substrate (a flexible substrate or a substrate having flexibility). The thickness of the support substrate 3, for example, is greater than or equal to 30 µm and less than or equal to 500 µm. In a case where the support substrate 3 is formed of a resin, it is preferable that the thickness of the support substrate 3 is greater than or equal to 45 µm from the viewpoint of the distortion, the wrinkle, and the stretch of the substrate in a continuous roll-to-roll method, and it is preferable that the thickness of the support substrate 3 is less than or equal to 125 µm from the viewpoint of the flexibility.

The support substrate 3, for example, is a plastic film. Examples of the material of the support substrate 3 include polyether sulfone (PES); a polyester resin such as polyethylene terephthalate (PET) and polyethylene naphthalate (PEN); a polyolefin resin such as polyethylene (PE), polypropylene (PP), and cyclic polyolefin; a polyamide resin; a polycarbonate resin; a polystyrene resin; polyvinyl alcohol resin; a saponified product of an ethylene-vinyl acetate copolymer; a polyacrylonitrile resin; an acetal resin; a polyimide resin; an epoxy resin, and the like.

Among the resins described above, the polyester resin or the polyolefin resin is preferable, and the polyethylene terephthalate or the polyethylene naphthalate is more preferable, as the material of the support substrate 3, since heat resistance is high, a linear expansion coefficient is low, and a production cost is low. In addition, only one type of such resins may be independently used, or two or more types thereof may be used by being combined.

A gas barrier layer or a moisture barrier layer may be arranged on one main surface 3a of the support substrate 3. The other main surface 3b of the support substrate 3 is a light emitting surface. Furthermore, the support substrate 3 may be thin film glass. In a case where the support substrate 3 is thin film glass, it is preferable that the thickness of the support substrate 3 is greater than or equal to 30 μm from the viewpoint of a strength, and it is preferable that the thickness of the support substrate 3 is less than or equal to 100 μm from the viewpoint of the flexibility.

[Positive Electrode Layer]

The positive electrode layer 5 is arranged on one main surface 3a of the support substrate 3. An electrode layer having light transmittivity is used in the positive electrode layer 5. Thin films of a metal oxide having a high electric conductivity, a metal sulfide, a metal, and the like can be used, and a thin film having a high light transmission rate is preferably used, as an electrode having light transmittivity. For example, thin films formed of indium oxide, zinc oxide, tin oxide, an indium tin oxide (abbreviated as ITO), an indium zinc oxide (abbreviated as IZO), gold, platinum, silver, copper, and the like are used, and among them, the thin film formed of ITO, IZO, or tin oxide is preferably used.

A transparent conductive film of an organic substance such as polyaniline and a derivative thereof, and polythiophene and a derivative thereof may be used as the positive electrode layer 5. In addition, an electrode in which the metals described above, metal alloys, and the like are patterned into the shape of a mesh, or an electrode in which a nanowire containing silver is formed into the shape of a network may be used as the positive electrode layer 5.

The thickness of the positive electrode layer 5 can be determined in consideration of light transmittivity, an electric conductivity, and the like. The thickness of the positive electrode layer 5 is generally 10 nm to 10 μm, is preferably 20 nm to 1 μm, and is more preferably 50 nm to 200 nm.

Examples of a forming method of the positive electrode layer 5 are capable of including a dry film formation method such as a vacuum thermal evaporation method, a sputtering method, and an ion plating method, and a coating method such as an ink jet method, a slit coater method, a gravure printing method, a screen printing method, and a spray coater method. In addition, in the positive electrode layer 5, a pattern can be formed by further using a photolithography method, a dry etching method, a laser trimming method, and the like. Direct coating is performed with respect to the support substrate 3 by using a coating method, and thus, it is possible to form the pattern without using the photolithography method, the dry etching method, the laser trimming method, and the like.

[Organic Functional Layer]

The organic functional layer 7 is arranged on a main surface of the positive electrode layer 5 (a surface on a side opposite to a surface in contact with the support substrate 3). The organic functional layer 7 includes a light emitting layer. In general, the organic functional layer 7 mainly contains a light emitting material emitting fluorescence and/or phosphorescence, or the light emitting material and a dopant material for a light emitting layer that aids the light emitting material. The dopant material for a light emitting layer, for example, is added in order to improve a light emitting efficiency or to change a light emitting wavelength. Furthermore, the light emitting material emitting the fluorescence and/or the phosphorescence may be a low-molecular compound, or may be a high-molecular compound. Examples of an organic substance comprising the organic functional layer 7 are capable of including the following light emitting materials emitting the fluorescence and/or the phosphorescence, such as a dye material, a metal complex material, and a high-molecular material, the following dopant materials for a light emitting layer, or the like.

(Dye Material)

Examples of the dye material are capable of including cyclopendamine and a derivative thereof, tetraphenyl butadiene and a derivative thereof, triphenyl amine and a derivative thereof, oxadiazole and a derivative thereof, pyrazoloquinoline and a derivative thereof, distyryl benzene and a derivative thereof, distyryl allylene and a derivative thereof, pyrrole and a derivative thereof, a thiophene compound, a pyridine compound, perynone and a derivative thereof, perylene and a derivative thereof, oligothiophene and a derivative thereof, an oxadiazole dimer, a pyrazoline dimer, quinacridone and a derivative thereof, coumarin and a derivative thereof, and the like.

(Metal Complex Material)

Examples of the metal complex material are capable of including a rare earth metal such as Tb, Eu, and Dy, a metal complex having Al, Zn, Be, Pt, Ir, or the like as a central metal, and oxadiazole, thiadiazole, phenyl pyridine, phenyl benzoimidazole, quinoline structure, or the like as a ligand, and the like. Examples of the metal complex are capable of including a metal complex emitting light from a triplet excitation state, such as an iridium complex and a platinum complex, an aluminum quinolinol complex, a benzoquinolinol beryllium complex, a benzooxazolyl zinc complex, a benzothiazole zinc complex, an azomethyl zinc complex, a porphyrin zinc complex, a phenanthroline europium complex, and the like.

(High-Molecular Material)

Examples of the high-molecular material are capable of including polyparaphenylene vinylene and a derivative thereof, polythiophene and a derivative thereof, polyparaphenylene and a derivative thereof, polysilane and a derivative thereof, polyacetylene and a derivative thereof, polyfluorene and a derivative thereof, polyvinyl carbazole and a derivative thereof, the dye material described above, a material in which a metal complex material is polymerized, and the like.

(Dopant Material For Light Emitting Layer)

Examples of the dopant material for a light emitting layer are capable of including perylene and a derivative thereof, coumarin and a derivative thereof, rubrene and a derivative thereof, quinacridone and a derivative thereof, squarylium and a derivative thereof, porphyrin and a derivative thereof, a styryl dye, tetracene and a derivative thereof, pyrazolone and a derivative thereof, decacyclene and a derivative thereof, phenoxazone and a derivative thereof, and the like.

The thickness of the organic functional layer 7 is generally approximately 2 nm to 200 nm. The organic functional layer 7, for example, is formed by a coating method using a coating liquid containing the light emitting material as described above (for example, ink). A solvent of the coating liquid containing the light emitting material is not limited insofar as the solvent dissolves the light emitting material. In addition, the light emitting material as described above may be formed by a vacuum thermal evaporation method.

[Negative Electrode Layer]

The negative electrode layer 9 is arranged on a main surface of the organic functional layer 7 (a surface on a side opposite to a surface in contact with the positive electrode layer 5). For example, an alkali metal, an alkali earth metal, a transition metal, a group 13 metal in the periodic table, and the like can be used as the material of the negative electrode layer 9. Specifically, for example, metals such as lithium, sodium, potassium, rubidium, cesium, beryllium, magnesium, calcium, strontium, barium, aluminum, scandium, vanadium, zinc, yttrium, indium, cerium, samarium, europium, terbium, and ytterbium, an alloy of two or more types of the metals, an alloy of one type of the metals, and one type of gold, silver, platinum, copper, manganese, titanium, cobalt, nickel, tungsten, and tin, graphite or a graphite interlayer compound, and the like are used as the material of the negative electrode layer 9. Examples of the alloy are capable of including a magnesium-silver alloy, a magnesium-indium alloy, a magnesium-aluminum alloy, an indium-silver alloy, a lithium-aluminum alloy, a lithium-magnesium alloy, a lithium-indium alloy, a calcium-aluminum alloy, and the like.

In addition, for example, a transparent conductive electrode is formed of a conductive metal oxide, a conductive organic substance, or the like can be used as the negative electrode layer 9. Specifically, examples of the conductive metal oxide are capable of including indium oxide, zinc oxide, tin oxide, ITO, IZO, and the like, and examples of the conductive organic substance are capable of including polyaniline and a derivative thereof, polythiophene and a derivative thereof, and the like. Furthermore, the negative electrode layer 9 may be configured of a laminated body in which two or more layers are laminated. Furthermore, there is also a case where an electron injection layer described below is used as the negative electrode layer 9.

The thickness of the negative electrode layer 9 is set in consideration of an electric conductivity and durability. The thickness of the negative electrode layer 9 is generally 10 nm to 10 μm, is preferably 20 nm to 1 μm, and is more preferably 50 nm to 500 nm.

Examples of a forming method of the negative electrode layer 9 are capable of including a coating method such as an ink jet method, a slit coater method, a gravure printing method, a screen printing method, and a spray coater method, a vacuum thermal evaporation method, a sputtering method, a laminating method in which a metal thin film is subjected to thermal compression bonding, and the like, and the vacuum thermal evaporation method or the sputtering method is preferable.

[Sealing Member]

The sealing member 11 is arranged on the uppermost portion in the organic EL element 1. The sealing member 11, for example, includes a sealing base material and an adhesive portion (not illustrated). The sealing base material is foamed of a metal foil, a barrier film in which a barrier functional layer is formed on any one or both of the surface and the back of a transparent plastic film, thin film glass having flexibility, a film in which a metal having barrier properties is laminated on a plastic film, and the like, and has a gas barrier function, in particular, a moisture barrier function. Copper, aluminum, or stainless steel is preferable as the metal foil, from the viewpoint of the barrier properties. It is preferable that the metal foil is thick from the viewpoint of suppressing a pinhole, and it is preferable that the thickness of the metal foil is 10 μm to 50 μm in consideration of the flexibility. The adhesive portion is used for allowing the sealing base material to adhere to the positive electrode layer 5, the organic functional layer 7, and the negative electrode layer 9. In addition, the adhesive portion may be arranged to cover at least a part of a function exhibition region of the organic functional layer, or may be arranged to surround at least a part of the function exhibition region.

[Method for Producing Organic EL Element]

Subsequently, a method for producing the organic EL element 1 having the configuration described above will be described.

Figure 2:
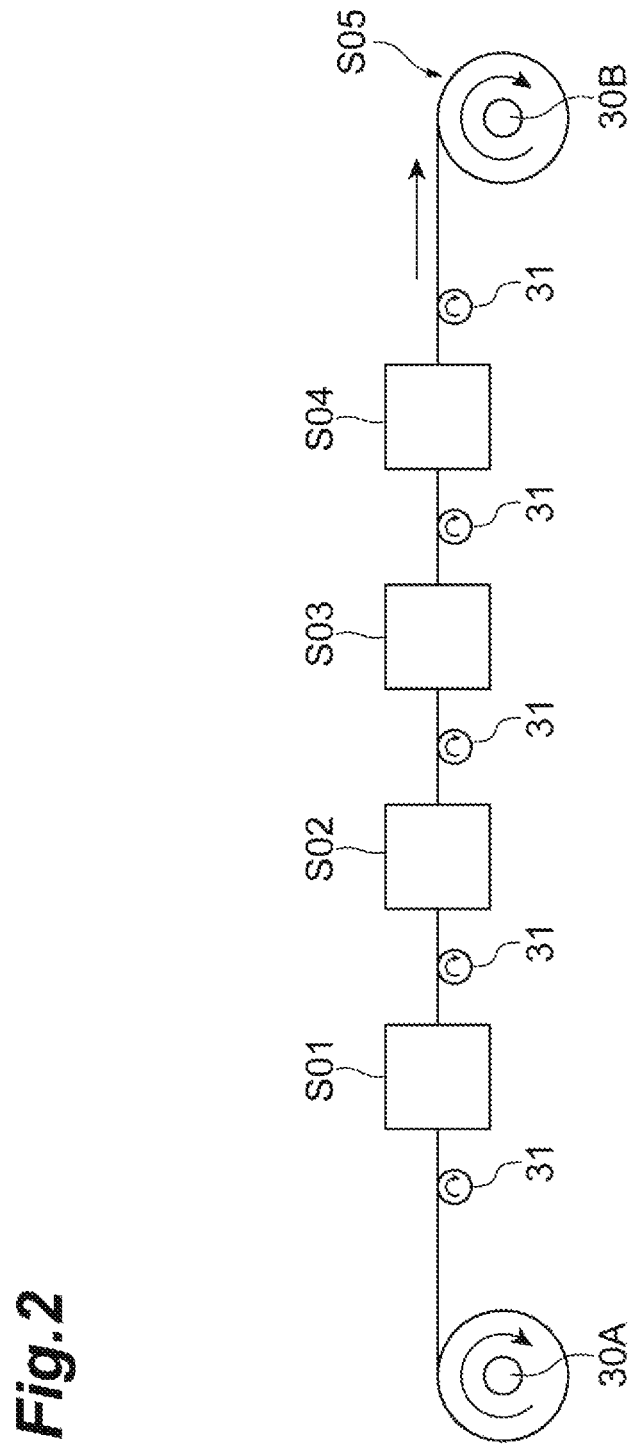
FIG. 2 is a diagram schematically illustrating a method for producing an organic EL element using a roll-to-roll method.
Figure 3:
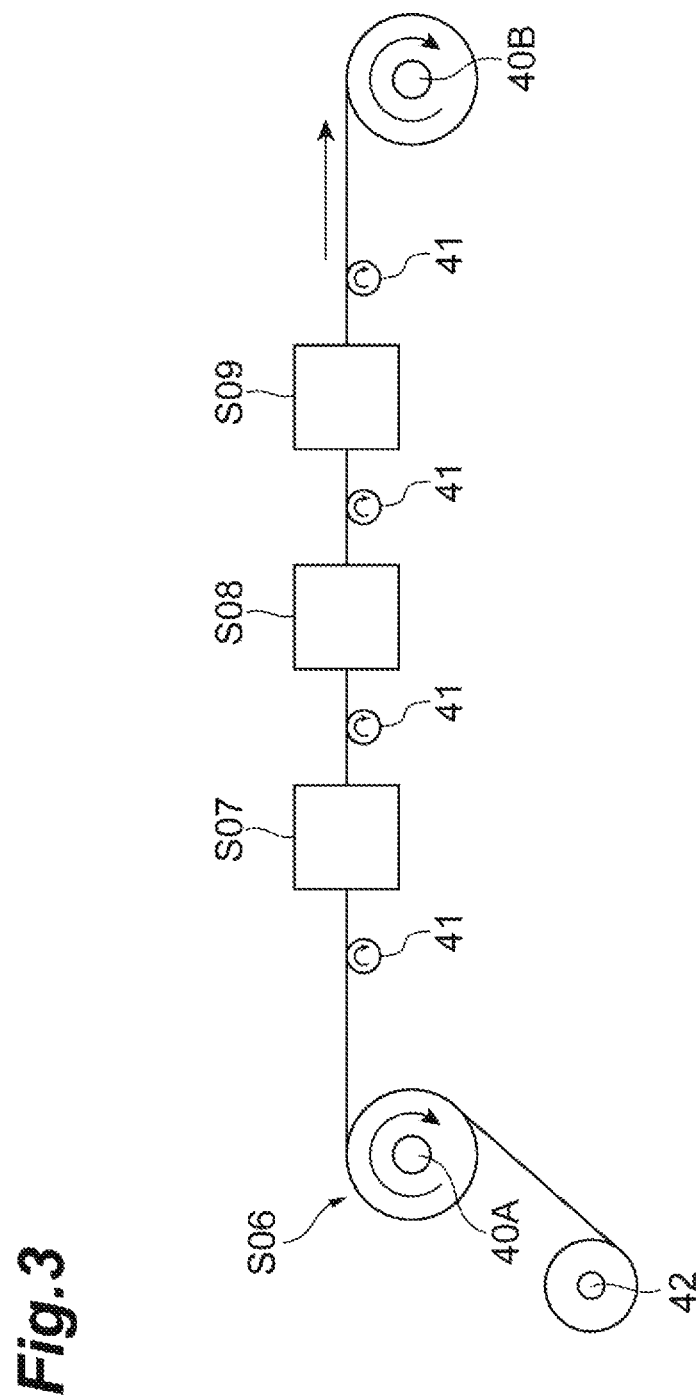
FIG. 3 is a diagram schematically illustrating the method for producing the organic EL element using the roll-to-roll method.

In a state where the support substrate 3 is a substrate that has flexibility and extends in a longitudinal direction, as conceptually illustrated in FIG. 2 and FIG. 3, a roll-to-roll method can be adopted. In a case where the organic EL element 1 is produced by a roll-to-roll method, each layer is sequentially formed from the support substrate 3 side while continuously conveying the elongated flexible support substrate 3 that is stretched between an unwinding roll 30A and a winding roll 30B and between an unwinding roll 40A and a winding roll 40B with conveyance rollers 31 and 41.

In a case where the organic EL element 1 is produced, first, the support substrate 3 is heated and dried (a substrate drying step S01). Next, the positive electrode layer 5 is formed on the dried support substrate 3 (one main surface 3a) (a positive electrode layer forming step (a first forming step) S02). The positive electrode layer 5 can be formed by using the forming method that is exemplified at the time of describing the positive electrode layer 5.

Subsequently, the organic functional layer 7 is formed on the positive electrode layer 5 (an organic functional layer forming step (a first forming step) S03). The organic functional layer 7 can be fanned by using the forming method that is exemplified at the time of describing the organic functional layer 7. In this embodiment, the organic functional layer 7 is formed by applying the light emitting material (the organic material) with the coating method, and by drying the light emitting material after being applied. In addition, the organic functional layer 7 may be formed by further applying an electron transport layer onto the light emitting material, and then, by drying the electron transport layer. Accordingly, as illustrated in FIG. 4, a support substrate 10 on which the organic functional layer is formed (hereinafter, referred to as the support substrate 10 with an organic functional layer) is produced.

Figure 4:
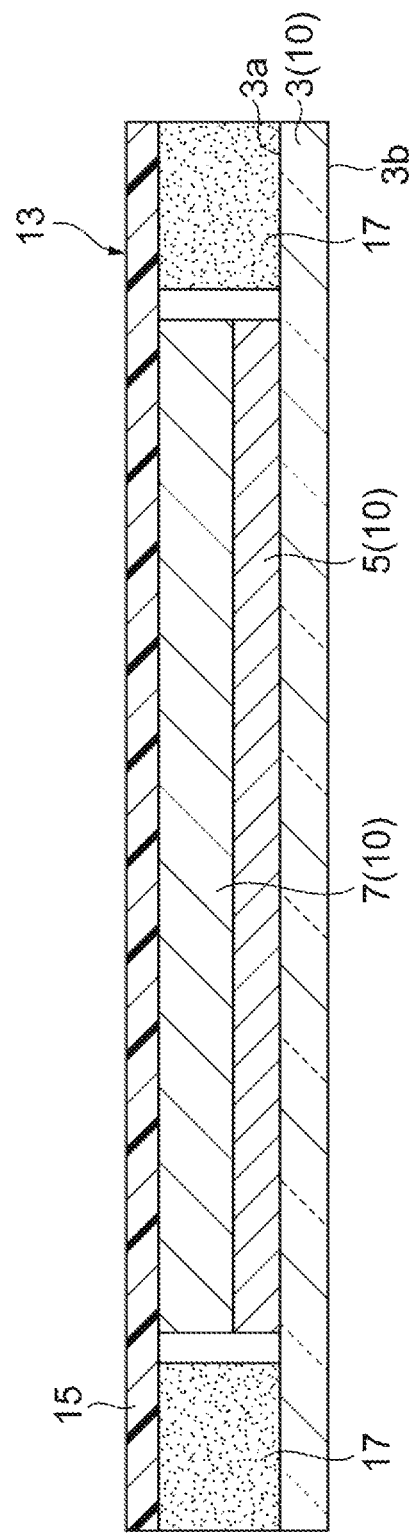
FIG. 4 is a diagram illustrating a method for producing an organic EL element.

Subsequently, as illustrated in FIG. 4, a protective film 13 (refer to FIG. 4) is arranged on the organic functional layer 7 (an arranging step S04). The protective film 13 includes a base material 15 and an adhesive portion 17. In this embodiment, the protective film 13 extends in the longitudinal direction of the support substrate 10 with an organic functional layer (a depth direction in FIG. 4), and the adhesive portion 17 is provided on both end portions in a width direction of the base material 15 (a direction orthogonal to the longitudinal direction, and a right-left direction in FIG. 4) along the longitudinal direction. A surface of the adhesive portion 17 on a side opposite to a surface in contact with the base material 15 has adhesiveness and peeling properties.

The protective film 13 is arranged on the organic functional layer 7 such that the adhesive portion 17 does not overlap with the organic functional layer 7 (such that the adhesive portion 17 is not positioned on the organic functional layer 7). Specifically, as illustrated in FIG. 4, the protective film 13 is arranged such that the organic functional layer 7 is positioned between a pair of adhesive portions 17. That is, the adhesive portion 17 of the protective film 13 is arranged in a region where the organic functional layer 7 is not formed in the support substrate 10 with an organic functional layer. Accordingly, the base material 15 of the protective film 13 is arranged on the organic functional layer 7.

Subsequently, the support substrate 10 with an organic functional layer and the protective film 13 are wound into the shape of a roll (a winding step S05). Accordingly, a roll is formed. Then, the roll, for example, is stored in a storage until the next step. At this time, the roll may be stored under an atmosphere of inert gas, vacuum, or dry air.

Subsequently, as illustrated in FIG. 3, the stored roll is prepared, the support substrate 10 with an organic functional layer and the protective film 13 are sent out from the unwinding roll 40A, and the protective film 13 is peeled off from the support substrate 10 with an organic functional layer (a peeling step S06). The peeled protective film 13 is wound around a core material 42. The peeling step S06 may be performed under an atmosphere of inert gas, vacuum, or dry air.

Subsequently, the support substrate 10 with an organic functional layer is heated (a heating step S07). In this embodiment, the support substrate 10 with an organic functional layer is heated by a heating chamber emitting an infrared ray. The infrared ray, for example, is a middle infrared ray. In the heating chamber, one main surface 3a side of the support substrate 10 with an organic functional layer is irradiated with the infrared ray, and the support substrate 10 with an organic functional layer (the positive electrode layer 5 and the organic functional layer 7) is heated. The heating chamber is under an atmosphere of inert gas, vacuum, or dry air. That is, the support substrate 10 with an organic functional layer may be heated under an atmosphere inert gas, vacuum, or dry air, that is identical to or different from the atmosphere of peeling off the protective film 13. The support substrate 10 with an organic functional layer may be conveyed under an atmosphere of inert gas, vacuum, or dry air until the protective film 13 is carried into the heating chamber after being peeled off. That is, the support substrate 10 with an organic functional layer is not atmospherically exposed until the protective film 13 is heated after being peeled off.

Subsequently, the negative electrode layer 9 is formed on the organic functional layer 7 (a negative electrode layer forming step (a second fanning step) S08). The negative electrode layer 9 can be formed by the same forming method that is exemplified at the time of describing the negative electrode layer 9. In addition, the negative electrode layer 9 may be configured of two or more layers including an electron injection layer and an electrode layer. For example, the electron injection layer exemplified below may be formed on the organic functional layer 7, and then, a layer may be formed by using the material of the negative electrode layer 9 that is exemplified at the time of describing the negative electrode layer 9. In this embodiment, the negative electrode layer 9 may be formed by a vacuum thermal evaporation method. More specifically, the negative electrode layer 9 is formed in a film formation chamber of which the total pressure is less than or equal to $1 \times 10^{-3}$ Pa and a moisture pressure is less than or equal to $1 \times 10^{-4}$ Pa. The support substrate 10 with an organic functional layer is conveyed (moved) under an atmosphere of inert gas, under a vacuum atmosphere, or under an atmosphere of dry air until the support substrate 10 with an organic functional layer is carried into the film formation chamber after being heated in the heating chamber. That is, the support substrate 10 with an organic functional layer is not atmospherically exposed until the negative electrode layer 9 is formed after being heated. Then, the sealing member 11 is arranged on the negative electrode layer 9 seals the organic functional layer 7 and the negative electrode layer 9 (a sealing step S09). As described above, the organic EL element 1 is produced.

As described above, in the method for producing the organic EL element 1 according to this embodiment, the support substrate 10 with an organic functional layer is heated before the negative electrode layer 9 is formed and after the protective film 13 is peeled off. Accordingly, the moisture and the like are contained in the protective film 13 that is wound along with the support substrate 10 with an organic functional layer, and thus, even in a case where the moisture and the like are in contact with (permeate through) the organic functional layer 7, the moisture and the like of the organic functional layer 7 are eliminated by the heating step S07. Therefore, in the method for producing the organic EL element 1, it is possible to suppress property degradation in the organic EL element 1 due to the moisture and the like of the organic functional layer 7 while protecting the organic functional layer 7 by the protective film 13. As a result thereof, in the method for producing the organic EL element 1, it is possible to improve the reliability of the organic EL element 1.

In addition, in the method for producing the organic EL element 1 of this embodiment, the moisture and the like of the organic functional layer 7 are eliminated by the heating step S07, and thus, it is not necessary to provide a drying agent, a moisture absorbing agent, or the like in the protective film 13. For this reason, in the method for producing the organic EL element 1, it is possible to suppress a cost increase due to the provision of the drying agent or the like in the protective film 13. In addition, in the method for producing the organic EL element 1, it is not necessary that a treatment such as dehydration is performed in advance with respect to the protective film 13, and thus, facility or a step for dehydrating the protective film is unnecessary, and it is possible to suppress a cost increase.

In the method for producing the organic EL element 1 according to this embodiment, in the heating step S07, the support substrate 10 with an organic functional layer is irradiated with an infrared ray. Specifically, in the heating step S07, one main surface 3a side of the support substrate 3 of the support substrate 10 with an organic functional layer on which the organic functional layer 7 is formed is irradiated with the infrared ray. Accordingly, in the method for producing the organic EL element 1, it is possible to effectively eliminate the moisture and the like of the organic functional layer 7.

In the method for producing the organic EL element 1 according to this embodiment, in the heating step S07, the support substrate 10 with an organic functional layer is heated under an atmosphere of inert gas, vacuum, or dry air. Accordingly, in the method for producing the organic EL element 1, in the heating step S07, it is possible to prevent the moisture and the like from being in contact with the organic functional layer 7.

In the method for producing the organic EL element 1 according to this embodiment, the protective film 13 includes the base material 15, and the adhesive portion 17 that is provided on the base material 15. In the winding step, the protective film 13 is arranged on the organic functional layer 7 such that the adhesive portion 17 does not overlap with the organic functional layer 7. Accordingly, in the method for producing the organic EL element 1, when the support substrate 10 with an organic functional layer and the protective film 13 are wound together, it is possible to prevent the protective film 13 from being shifted by the adhesive portion 17. In addition, in the method for producing the organic EL element 1, in the peeling step S06 of peeling off the protective film 13, for example, it is possible to prevent the surface of the organic functional layer 7 from being peeled off by the adhesive portion 17, and to prevent the organic functional layer 7 from being broken.

In the organic EL element 1 according to this embodiment, the organic material is applied onto the positive electrode layer 5, and is dried, and thus, the organic functional layer 7 is formed. As described above, in a case where the organic functional layer 7 is formed by the coating method, the organic functional layer 7 is easily affected by the moisture and the like. For this reason, the method for producing the organic EL element 1 according to this embodiment in which the support substrate 10 with an organic functional layer (the organic functional layer 7) is heated before the negative electrode layer 9 is formed after the protective film 13 is peeled off is particularly effective in a case where the organic functional layer 7 is formed by the coating method.

(Second Embodiment)

Figure 5:
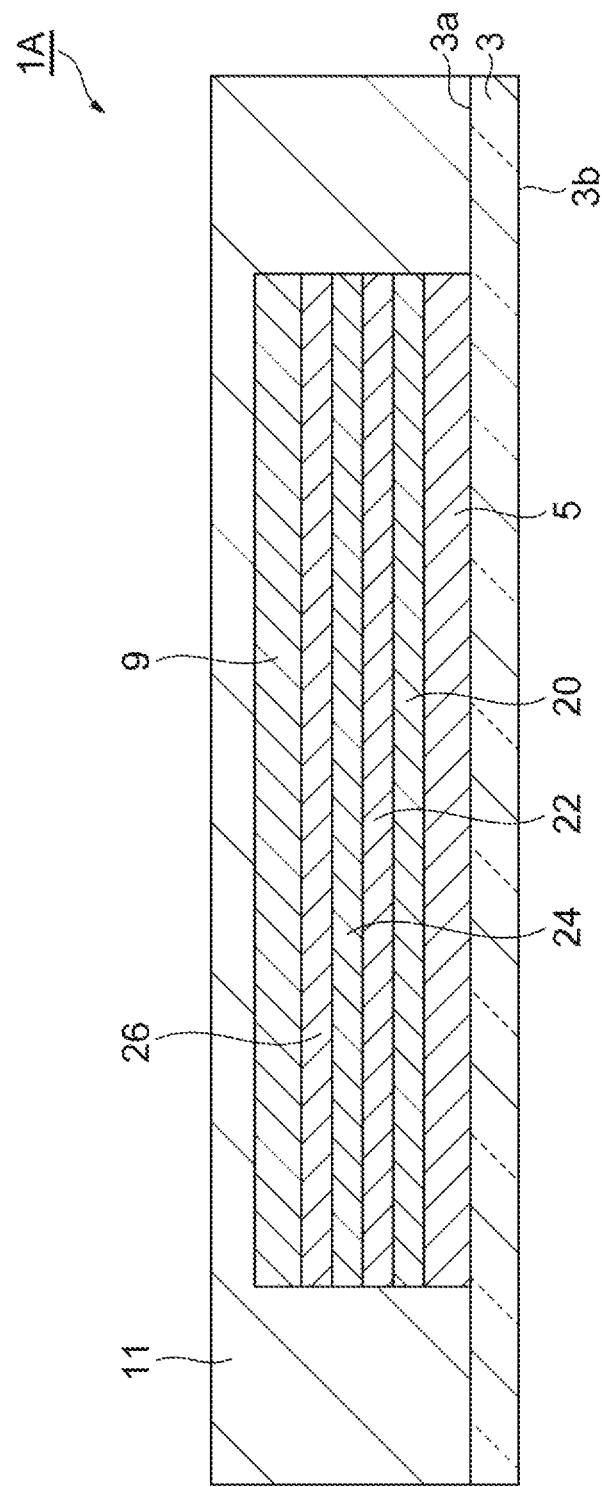
FIG. 5 is a sectional view of the organic EL element that is produced by a method for producing an organic device according to a second embodiment.

Subsequently, a second embodiment will be described. As illustrated in FIG. 5, an organic EL element 1A that is produced by a method for producing an organic device of this embodiment includes the support substrate 3, the positive electrode layer 5, a hole injection layer 20, a hole transport layer 22, a light emitting layer 24, an electron transport layer 26, the negative electrode layer 9, and the sealing member 11. The hole injection layer 20, the hole transport layer 22, the light emitting layer 24, and the electron transport layer 26 configure an organic functional layer. The light emitting layer 24 has the same configuration as that of the light emitting layer included in the organic functional layer 7 described above.

[Hole Injection Layer]

The hole injection layer 20 is a layer having a function of improving a hole injection efficiency with respect to the light emitting layer 24 from the positive electrode layer 5. The thickness of the hole injection layer 20, for example, is 1 nm to 1 μm, is preferably 2 nm to 500 nm, and is more preferably 5 nm to 200 nm. Known hole injection materials can be used as the material of the hole injection layer 20. Examples of the hole injection material are capable of including an oxide such as vanadium oxide, molybdenum oxide, ruthenium oxide, and aluminum oxide, a phenyl amine compound, a starburst type amine compound, a phthalocyanine compound, amorphous carbon, polyaniline, a polythiophene derivative, and the like.

The hole injection layer 20, for example, is formed by a coating method such as an ink jet method and a spin coating method.

[Hole Transport Layer]

The hole transport layer 22 is a layer having a function of improving hole injection with respect to the light emitting layer 24 from the positive electrode layer 5, the hole injection layer 20, or the hole transport layer 22 that is closer to the positive electrode layer 5. The thickness of the hole transport layer 22, for example, is 1 nm to 1 μm, is preferably 2 nm to 500 nm, and is more preferably 5 nm to 200 nm. Known hole transport materials can be used as the material of the hole transport layer 22. Examples of the hole transport material are capable of including polyvinyl carbazole or a derivative thereof, polysilane or a derivative thereof, polysiloxane having aromatic amine on a side chain or a main chain or a derivative thereof, pyrazoline or a derivative thereof, aryl amine or a derivative thereof, stilbene or a derivative thereof, triphenyl diamine or a derivative thereof, polyaniline or a derivative thereof, polythiophene or a derivative thereof, polyaryl amine or a derivative thereof, polypyrrole or a derivative thereof, poly(p-phenylene vinylene) or a derivative thereof, poly(2,5-thienylene vinylene) or a derivative thereof, and the like. In addition, it is preferable that the hole transport layer 22 contains at least one type selected from the group consisting of a crosslinkable high-molecular compound having hole transport properties, and a cross-linked body of the high-molecular compound, and example of the crosslinkable high-molecular compound are also capable of including high-molecular compounds described or exemplified in International Publication WO 2013/114976, International Publication WO 2013/146806, International Publication WO 2015/163174, International Publication WO 2016/052337, Japanese Unexamined Patent Application Publication No. 2016-111355, International Publication WO 2016/005749, International Publication WO 2016/005750, and the like.

The hole transport layer 22, for example, is formed by a coating method such as a ink jet method and a spin coating method.

[Electron Transport Layer]

Known electron transport materials can be used in the electron transport layer 26. Examples of the electron transport material include an aromatic hydrocarbon compound or an aromatic heterocyclic compound of an aromatic ring-containing tetracarboxylic acid anhydride or the like such as triazole and a derivative thereof, oxazole and a derivative thereof, imidazole and a derivative thereof, fluorene and a derivative thereof, benzoquinone and a derivative thereof, naphthoquinone and a derivative thereof, anthraquinone and a derivative thereof, tetracyanoanthraquinodimethane and a derivative thereof, fluorenone and a derivative thereof, diphenyl dicyanoethylene and a derivative thereof, diphenoquinone and a derivative thereof, anthraquinodimethane and a derivative thereof, anthrone and a derivative thereof, thiopyrane dioxide and a derivative thereof, carbodiimide and a derivative thereof, fluorenylidene methane and a derivative thereof, distyryl pyrazine and a derivative thereof, naphthalene, and perylene; a metal complex having metal phthalocyanine, benzooxazole, or benzothiazole as a ligand, a metal complex of phthalocyanine and a derivative thereof, 8-quinolinol and a derivative thereof, an organic silane compound, and 8-hydroxy quinoline and a derivative thereof, and the like. The electron transport material may be an alkali metal salt and an alkali earth metal salt of the compounds described above, and a halide of an alkali metal and an alkali earth metal, and a salt such as an oxide salt and a carbonate.

It is preferable that the electron transport material is an aromatic hydrocarbon compound or an aromatic heterocyclic compound, or an alkali metal salt or an alkali earth metal salt thereof. In the electron transport material, prolonged life of a light emitting element becomes remarkable by setting the amount of hydrogen fluoride to be in a predetermined range, and thus, it is preferable that the electron transport material contains a salt configured of a carboxylic acid ion and an alkali metal ion or an alkali earth metal ion.

The electron transport material may be a high-molecular compound, or may be a low-molecular compound. In a case where the electron transport material is a high-molecular compound, the high-molecular compound, for example, can be synthesized in accordance with methods described in Japanese Unexamined Patent Application Publication No. 2009-239279, Japanese Unexamined Patent Application Publication No. 2012-033845, Japanese Unexamined Patent Application Publication No. 2012-216821, Japanese Unexamined Patent Application Publication No. 2012-216822, and Japanese Unexamined Patent Application Publication No. 2012-216815. In a case where the electron transport material is a low-molecular compound, examples of the low-molecular compound include compounds and the like described in International Publication WO10/090077, Japanese Unexamined Patent Application Publication No. 2012-89777, Japanese Unexamined Patent Application Publication No. 2012-104536, Japanese Unexamined Patent Application Publication No. 2013-16717, Japanese Unexamined Patent Application Publication No. 2013-100239, International Publication WO/004639, Japanese Unexamined Patent Application Publication No. 2013-38432, Japanese Unexamined Patent Application Publication No. 2013-258416, Japanese Unexamined Patent Application Publication No. 2014-131079, and Japanese Unexamined Patent Application Publication No. 2015-167236.

The electron transport layer, for example, is formed by a coating method such as an ink jet method and a spin coating method.

[Method For Producing Organic EL Element]

Subsequently, a method for producing the organic EL element 1A having the configuration described above will be described. As with the organic EL element 1, a roll-to-roll method is adopted in the method for producing the organic EL element 1A. First, the support substrate 3 is heated and dried. Next, the positive electrode layer 5 is formed on the support substrate 3 (one main surface 3a). Such steps are identical to the substrate drying step S01 described above and the positive electrode layer forming step (the first forming step) S02 described above.

Subsequently, the hole injection layer 20, the hole transport layer 22, and the light emitting layer 24 are formed on the positive electrode layer 5 in this order (an organic functional layer forming step (a first forming step)). The hole injection layer 20, the hole transport layer 22, and the light emitting layer 24 can be respectively formed by the forming method that is exemplified at the time of describing each layer. In this embodiment, the hole injection layer 20, the hole transport layer 22, and the light emitting layer 24 are respectively formed by performing coating with a coating method, and by performing drying after the coating. Accordingly, a support substrate is produced on which the hole injection layer 20, the hole transport layer 22, and the light emitting layer 24 are formed.

As with the support substrate with an organic functional layer in the method for producing the organic EL element 1, the arranging step S04, the winding step S05, the peeling step S06, and the heating step S07 described above are performed with respect to the support substrate on which the hole injection layer 20, the hole transport layer 22, and the light emitting layer 24 are formed.

Subsequently, the electron transport layer 26 is formed on the light emitting layer 14. The electron transport layer 26 can be formed by the forming method that is exemplified at the time of describing the electron transport layer 26. In this embodiment, the electron transport layer 26 is formed by performing coating with a coating method, and by performing drying after the coating.

Subsequently, the negative electrode layer 9 is formed on the electron transport layer 26. Then, the sealing member 11 is arranged on the negative electrode layer 9, and seals the hole injection layer 20, the hole transport layer 22, the light emitting layer 24, the electron transport layer 26, and the negative electrode layer 9. Such steps are identical to the negative electrode layer foaming step (the second forming step) S08 described above and the sealing step S09 described above. As described above, the organic EL element 1A is produced.

As described above, the embodiments of the present invention have been described, but the present invention is not necessarily limited to the embodiments described above, and can be variously modified within a range not departing from the gist thereof.

For example, in the embodiments described above, the organic EL element 1 is exemplified in which the organic functional layer 7 including the light emitting layer is arranged between the positive electrode layer 5 and the negative electrode layer 9. However, the configuration of the organic functional layer 7 is not limited thereto. The organic functional layer 7 may have the following configurations.

(a) (Positive Electrode Layer)/Light Emitting Layer/(Negative Electrode Layer)

(b) (Positive Electrode Layer)/Hole Injection Layer/Light Emitting Layer/(Negative Electrode Layer)

(c) (Positive Electrode Layer)/Hole Injection Layer/Light Emitting Layer/Electron Injection Layer/(Negative Electrode Layer)

(d) (Positive Electrode Layer)/Hole Injection Layer/Light Emitting Layer/Electron Transport Layer/Electron Injection Layer/(Negative Electrode Layer)

(e) (Positive Electrode Layer)/Hole Injection Layer/Hole Transport Layer/Light Emitting Layer/(Negative Electrode Layer)

(f) (Positive Electrode Layer)/Hole Injection Layer/Hole Transport Layer/Light Emitting Layer/Electron Injection Layer/(Negative Electrode Layer)

(g) (Positive Electrode Layer)/Hole Injection Layer/Hole Transport Layer/Light Emitting Layer/Electron Transport Layer/Electron Injection Layer/(Negative Electrode Layer)

(h) (Positive Electrode Layer)/Light Emitting Layer/Electron Injection Layer/(Negative Electrode Layer)

(i) (Positive Electrode Layer)/Light Emitting Layer/Electron Transport Layer/Electron Injection Layer/(Negative Electrode Layer)

Here, a symbol "/" indicates that respective layers interposing the symbol "/" are laminated to be adjacent to each other. The configuration represented in (a) described above indicates the configuration of the organic EL element 1 in the embodiment described above.

The electron injection layer may be one layer comprising the organic functional layers, or may be configured only of an inorganic substance. Known electron injection materials can be used in the electron injection layer. Examples of the electron injection material are capable of including an alloy containing one or more types of an alkali metal, an alkali earth metal, an alkali metal, and an alkali earth metal, an oxide, a halide, and a carbonate of an alkali metal or an alkali earth metal, a mixture of such substances, and the like. Examples of the oxide, the halide, and the carbonate of the alkali metal and the alkali metal are capable of including lithium, sodium, potassium, rubidium, cesium, lithium oxide, lithium fluoride, sodium oxide, sodium fluoride, potassium oxide, potassium fluoride, rubidium oxide, rubidium fluoride, cesium oxide, cesium fluoride, lithium carbonate, and the like. In addition, examples of the oxide, the halide, and the carbonate of the alkali earth metal and the alkali earth metal are capable of including magnesium, calcium, barium, strontium, magnesium oxide, magnesium fluoride, calcium oxide, calcium fluoride, barium oxide, barium fluoride, strontium oxide, strontium fluoride, magnesium carbonate, and the like. In addition, a layer in which an organic material having electron transport properties, known in the related art, an organic metal complex of an alkali metal are mixed together can be used as the electron injection layer.

The electron injection layer can be formed by a predetermined known method such as a deposition method, a sputtering method, and a coating method (for example, an ink jet method and a spin coating method). It is preferable that the thickness of the electron injection layer 25 is approximately 1 nm to 1 µm.

The organic EL element 1 may include a single organic functional layer 7, or may include two or more layers of the organic functional layers 7. In any one of layer configurations of (a) to (i) described above, in a case where a laminated structure that is arranged between the positive electrode layer 5 and the negative electrode layer 9 is set to "Structure Unit A", examples of the configuration of the organic EL element including two layers of the organic functional layers 7 are capable of including a layer configuration represented in (j) described below. Two layer configurations of (structure unit A) may be identical to each other, or may be different from each other.

(j) Positive Electrode Layer/(Structure Unit A)/Charge Generating Layer/(Structure Unit A)/Negative Electrode Layer Here, the charge generating layer is a layer that generates holes and electrons by applying an electric field. Examples of the charge generating layer are capable of including a thin film formed of vanadium oxide, ITO, molybdenum oxide, and the like.

In addition, in a case where "(Structure Unit A)/Charge Generating Layer" is set to "Structure Unit B", examples of the configuration of the organic EL element including three or more layers of the organic functional layers 7 are capable of including a layer configuration represented in (k) described below.

(k) Positive Electrode Layer/(Structure Unit B) x/(Structure Unit A)/Negative Electrode Layer A symbol "x" indicates an integer of greater than or equal to 2, and "(Structure Unit B) x" indicates a laminated body in which (Structure Unit B) is laminated in x stages. In addition, a plurality of layer configurations of (Structure Unit B) may be identical to each other, or may be different from each other.

The organic EL element may be configured by directly laminating a plurality of organic functional layers 7 without providing the charge generating layer.

As described above, in the case of a plurality of organic functional layers 7, in the first forming step, at least one layer among the multiple organic functional layers 7 may be formed, and then, the protective film 13 may be arranged on the layer. In this case, the protective film 13 is peeled off, and then, the support substrate 3 is heated, a layer that is not formed in the first forming step among the layers comprising the multiple organic functional layers 7, and the negative electrode layer 9 are formed. In the embodiments described above, a mode has been described in which the light emitting layer 24 is formed, and then, the protective film 13 is arranged and wound, the protective film 13, is peeled off, and the electron transport layer 26 is formed through the heating step. However, the hole transport layer 22 may be formed, and then, the protective film 13 may be arranged and wound, the protective film 13 may be peeled off, and the light emitting layer 24 and the electron transport layer 26 may be sequentially formed through the heating step. In addition, in the second forming step, one organic functional layer that is not formed in the first forming step among the layers comprising the multiple organic functional layers 7 may be formed, and then, the protective film 13 may be arranged and wound, the protective film 13 may be peeled off, and the remaining organic functional layer 7 and the negative electrode layer 9 may be formed through the heating step.

In the embodiments described above, a mode in which the protective film 13 is arranged on the organic functional layer 7 such that the adhesive portion 17 of the protective film 13 does not overlap with the organic functional layer 7 has been described as an example. However, an arrangement mode of the protective film is not limited thereto.

Figure 6:
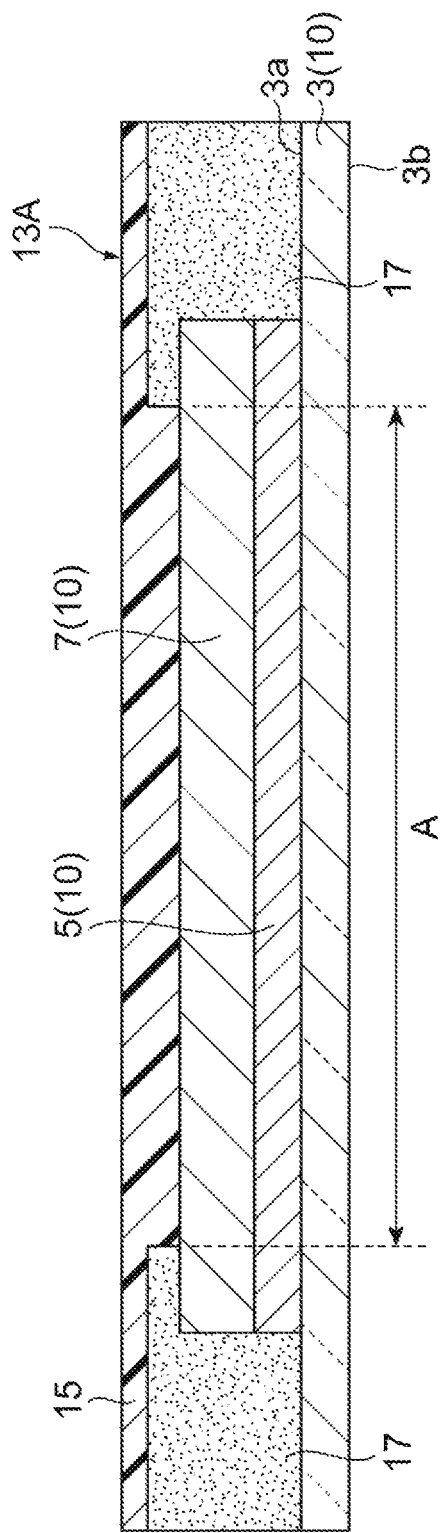
FIG. 6 is a diagram illustrating a method for producing an organic EL element according to another embodiment.

For example, as illustrated in FIG. 6, in a protective film 13A, a part of the adhesive portion 17 may be arranged on the organic functional layer 7. Specifically, the adhesive portion 17 may be arranged in a position not including a light emitting region (a function exhibition region) A of the organic functional layer 7, on the organic functional layer 7. Accordingly, when the support substrate 3 and the protective film 13A are wound together, it is possible to prevent the protective film 13A from being shifted by the adhesive portion 17. In addition, the adhesive portion 17 is arranged not to overlap with the light emitting region A in the organic functional layer 7, and thus, even in a case where the adhesive portion 17 is arranged on a part of the organic functional layer 7, and a part of the surface of the organic functional layer 7 is peeled off when the protective film 13 is peeled off, a light emitting grade is not affected.

In the embodiments described above, a mode in which the protective films 13 and 13A include the base material 15 and the adhesive portion 17 has been described as an example. However, as illustrated in FIG. 7, a protective film 13B may be configured only of a base material.

In a case where the protective film 13B is configured only of a base material, the protective film 13B is not fixed to the support substrate 3, but the protective film 13B and the support substrate 3 are simultaneously conveyed to a winding portion, and are wound, and thus, it is possible to arrange the protective film 13B on the organic functional layer 7 of the support substrate 3 on which the organic functional layer 7 is formed. At this time, the arranging step S04 and the winding step S05 are simultaneously performed.

In addition to the embodiments described above, in the sealing step S09, the sealing member 11 may be pasted onto the negative electrode layer 9, and then, a light extraction film may be pasted to the other main surface 3b of the support substrate 3, or a protective film may be pasted onto the sealing member 11. In addition, the protective film may be provided in advance on the sealing member 11.

In the embodiments described above, a mode in which the first electrode layer is the positive electrode layer, and the second electrode layer is the negative electrode layer has been described as an example. However, the first electrode layer may be the negative electrode layer, and the second electrode layer may be the positive electrode layer.

In the embodiments described above, the organic EL element has been described as an example of the organic device. The organic device may be an organic thin film transistor, an organic photo-detector, an organic thin film solar battery, and the like.

EXAMPLES

Hereinafter, the present invention will be described in more detail on the basis of examples and comparative examples, but the present invention is not limited thereto.

Example 1

An organic EL element having a configuration described below was prepared.

Glass Substrate/ITO Layer (Thickness of 45 nm)/Hole Injection Layer (Thickness of 35 nm)/Hole Transport Layer (Thickness of 20 nm)/Light Emitting Layer (Thickness of 75 nm)/Electron Transport Layer (Thickness of 10 nm)/NaF Layer (Thickness of 4 nm)/Al Layer (Thickness of 100 nm)

An ITO film (a positive electrode) having a thickness of 45 nm was formed by a sputtering method, and a glass substrate that was patterned by a photolithography method was subjected to dry cleaning in a UV ozone washer. After that, a hole injection material ND-3202 (Solid Content Concentration: 2.0 weight %), manufactured by Nissan Chemical Corporation, was formed into a film having a film thickness of 35 nm by a spin coating method, as a hole injection layer. A substrate on which the hole injection material was formed into the film was heated on a hot plate at 80° C. for 4 minutes under an air atmosphere from which ozone was eliminated, a solvent was volatilized, and then, a heat treatment was performed on a hot plate at 230° C. for 15 minutes.

Next, a xylene solution was prepared in which a hole transport layer material 1 exemplified as described above was dissolved in xylene. The concentration of the hole transport material 1 in the xylene solution was set to 0.7 weight %. Next, in an air atmosphere, the obtained xylene solution was applied onto the glass substrate by a spin coating method, and thus, a coating film of a hole transport layer having a thickness of 20 nm was formed. Further, in a nitrogen gas atmosphere of which an oxygen concentration and a moisture concentration were controlled such that the oxygen concentration and the moisture concentration were respectively less than or equal to 10 ppm at a volume ratio, the coating film was retained at 180° C. for 60 minutes, and was dried and burned. Accordingly, the hole transport layer material 1 was cross-linked, and thus, the hole transport layer insoluble in the solvent in which a light emitting layer material 1 was dissolved was obtained.

Next, a toluene solution was prepared in which the light emitting layer material 1 that is the material of the light emitting layer exemplified as described above was dissolved in toluene. The concentration of the light emitting layer material 1 in the toluene solution was set to 3.0 weight %. In an air atmosphere, the obtained toluene solution was applied onto the glass substrate by a spin coating method, and thus, a coating film for a light emitting layer having a thickness of 75 nm was formed. Further, in a nitrogen gas atmosphere of which an oxygen concentration and a moisture concentration were controlled such that the oxygen concentration and the moisture concentration were respectively less than or equal to 10 ppm at a volume ratio, the coating film was retained at 130° C. for 10 minutes, and was dried, and thus, a light emitting layer was obtained.

Next, a solution was prepared in which an electron transport layer material 1 that is the material of the electron transport layer exemplified as described above was dissolved. It was possible to select a solvent in which a lower layer was not dissolved, and a polar solvent was used. The concentration of the electron transport material 1 in a solution of the polar solvent was set to 0.3 weight %. In an air atmosphere, the obtained solution of the polar solvent was applied onto the glass substrate by a spin coating method, and a coating film for an electron transport layer having a thickness of 10 nm was formed. Further, in a nitrogen gas atmosphere of which an oxygen concentration and a moisture concentration were controlled such that the oxygen concentration and the moisture concentration were respectively less than or equal to 10 ppm at a volume ratio, the coating film was retained at 130° C. for 10 minutes, and was dried, and thus, an electron transport layer was obtained.

Next, a biaxially stretched polyester (PET) film (Product Name: Lumirror, manufactured by Toray Industries, Inc.) was arranged on the glass substrate on which the layers up to the electron transport layer were formed, to have a size of covering the entire light emitting area, and to be in contact with the electron transport layer, as a protective film. Further, the electron transport layer and the protective film were closely attached to each other by being pressurized at 1/21 kgf from the protective film.

Next, as described above, the protective film was removed after 16 hours since the electron transport layer and the protective film were closely attached to each other, and in a nitrogen gas atmosphere of which an oxygen concentration and a moisture concentration were controlled such that the oxygen concentration and the moisture concentration were respectively less than or equal to 10 ppm at a volume ratio, heating and retention were performed on a hot plate at 130° C. for 10 minutes.

Next, the substrate was transported into a vacuum chamber, and in vacuum of less than or equal to $9 \times 10^{-5}$ Pa, sodium fluoride (NaF) was deposited at a deposition rate of approximately 0.03 nm/second to have a thickness of approximately 4 nm, and thus, an electron injection layer was formed. Further, aluminum (Al) was deposited at a deposition rate of approximately 0.4 nm/second to have a thickness of approximately 200 nm, and thus, a negative electrode was formed. After that, sealing was performed by using a glass substrate that is a sealing substrate, and thus, an organic EL element was prepared.

Comparative Example 1

In Comparative Example 1, an organic EL element was prepared as with the example except that the protective film was removed after 16 hours since the electron transport layer and the protective film were closely attached to each other, and after that, heating and retention were not performed on the hot plate, as described above.

Reference Example

In a reference example, an organic EL element was prepared as with Example 1 except that storage was performed for 16 hours in a nitrogen gas atmosphere of which an a oxygen concentration and a moisture concentration were controlled such that the oxygen concentration and the moisture concentration were respectively less than or equal to 10 ppm at a volume ratio, and heating and retention were performed on a hot plate at 130° C. for 10 minutes, without arranging the protective film on the electron transport layer, as described above.

(Measurement of Driving Lifetime of Device)

A suitable voltage was applied to each of the prepared organic EL elements such that the luminances of each of the organic EL elements were the same, and thus, the luminance was set to an initial luminance. Next, a photon amount (a light intensity) from each of the organic EL elements was measured with a photo-detector, and a time until the light intensity decreased to 70% of the initial luminance was measured. As a result thereof, in Example 1, the time was approximately 254 hours, in Comparative Example 1, the time was 21 hours, and in Comparative Example 2, the time was 256 hours.

In comparison between Example 1 and Comparative Example 1, it is known that in Comparative Example 1 in which the negative electrode and the protective film are closely attached to each other, and then, are not heated, the driving lifetime is shortened, and in the case of performing the heating, the driving lifetime greatly extends by approximately 12 times. On the other hand, the same driving lifetime was obtained in the reference example not using the protective film, and in Example 1, and thus, it was known that in Example 1, it was possible to substantially improve degraded driving lifetime properties by using the protective film. Accordingly, it was possible to suppress property degradation in an organic device and a decrease in the reliability of the organic device.

REFERENCE SIGNS LIST 1, 1A: organic EL element (organic device), 3: support substrate, 3a: one main surface, 5: positive electrode layer (first electrode layer), 7: organic functional layer, 9: negative electrode layer (second electrode layer), 10: support substrate with organic functional layer, 13, 13A, 13B: protective film, S02: positive electrode layer forming step (first forming step), S03: organic functional layer forming step (second forming step), S04: arranging step (winding step), S05: winding step, S06: peeling step, S07: heating step, S08: negative electrode layer forming step (second forming step).

The invention claimed is:

1. A method for producing an organic device in which a first electrode layer, a single or multiple organic functional layers, and a second electrode layer are arranged on one main surface of a support substrate having flexibility in this order, the method comprising:
   a first forming step of forming the first electrode layer and at least one layer of the organic functional layers on the support substrate to produce a support substrate with an organic functional layer;
   a winding step of winding the support substrate with an organic functional layer and a protective film by arranging the protective film on the organic functional layer after the first forming step;
   a peeling step of feeding out the protective film and the support substrate with the at least one layer of the organic functional layers that have been wound in, and peeling off the protective film before forming at least one layer selected from the second electrode layer and an organic functional layer not formed in the first forming step and being one of the organic functional layers comprising the multiple organic functional layers;
   a heating step of heating the support substrate with an organic functional layer before forming at least one layer selected from the second electrode layer and an organic functional layer not formed in the first forming step and being one of the organic functional layers comprising the multiple organic functional layers, after the peeling step; and
   a second forming step of forming at least one layer selected from the second electrode layer and an organic functional layer not formed in the first forming step and being one of the organic functional layers comprising the multiple organic functional layers, on the support substrate with an organic functional layer, after the heating step.

2. The method for producing the organic device according to claim 1,
   wherein in the second forming step, the second electrode layer is formed by a vacuum thermal evaporation method or a sputtering method.

3. The method for producing the organic device according to claim 1,
   wherein in the heating step, the support substrate with an organic functional layer is irradiated with an infrared ray.

4. The method for producing the organic device according to claim 1,
   wherein in the heating step, the only one main surface of the support substrate with an organic functional layer is heated.

5. The method for producing the organic device according to claim 1,
   wherein in the heating step, the support substrate with an organic functional layer is heated under an atmosphere of inert gas, vacuum, or dry air.

6. The method for producing the organic device according to claim 1,
   wherein the protective film includes a base material, and an adhesive portion that is provided on the base material, and
   in the winding step, the protective film is arranged on the organic functional layer such that the adhesive portion does not overlap with the organic functional layer.

7. The method for producing the organic device according to claim 1,
   wherein the protective film includes a base material, and an adhesive portion that is provided on the base material, and
   in the winding step, the protective film is arranged on the organic functional layer such that the adhesive portion does not overlap with a function exhibition region of the organic functional layer.

8. The method for producing the organic device according to claim 1,
   wherein in the first foaming step, the organic functional layer is formed by applying an organic material onto the first electrode layer and by drying the organic material.

9. The method for producing the organic device according to claim 1,
   wherein the support substrate with an organic functional layer is conveyed under an atmosphere of vacuum, inert gas, or dry air, from the heating step to the second forming step.

* * * * *